United States Patent
Lee et al.

(10) Patent No.: US 11,555,150 B2
(45) Date of Patent: Jan. 17, 2023

(54) ETCHING COMPOSITION FOR SILICON NITRIDE FILM

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Seong Hwan Kim, Daegu (KR); Seung Oh Jin, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 0 days.

(21) Appl. No.: 17/430,480

(22) PCT Filed: Feb. 10, 2020

(86) PCT No.: PCT/KR2020/001801
§ 371 (c)(1),
(2) Date: Aug. 12, 2021

(87) PCT Pub. No.: WO2020/180016
PCT Pub. Date: Sep. 10, 2020

(65) Prior Publication Data
US 2022/0127530 A1 Apr. 28, 2022

(30) Foreign Application Priority Data
Mar. 6, 2019 (KR) .................. 10-2019-0025511

(51) Int. Cl.
*C09K 13/06* (2006.01)
*C09K 13/08* (2006.01)
*H01L 21/306* (2006.01)

(52) U.S. Cl.
CPC .............. *C09K 13/06* (2013.01); *C09K 13/08* (2013.01); *H01L 21/30604* (2013.01)

(58) Field of Classification Search
None
See application file for complete search history.

(56) References Cited

U.S. PATENT DOCUMENTS

| | | | | |
|---|---|---|---|---|
| 5,728,203 A | * | 3/1998 | Vorse | C09D 183/14 106/287.11 |
| 6,605,365 B1 | * | 8/2003 | Krienke | C23C 18/1216 428/328 |
| 2006/0139561 A1 | * | 6/2006 | Hofmann | G03F 7/0017 349/155 |
| 2015/0247087 A1 | * | 9/2015 | Kamimura | C09K 13/10 252/79.3 |
| 2016/0152838 A1 | * | 6/2016 | Wolpers | C09D 5/082 106/14.12 |
| 2017/0243737 A1 | * | 8/2017 | Tanigaki | G03F 7/0757 |
| 2020/0276610 A1 | * | 9/2020 | Müller | C23C 22/53 |

FOREIGN PATENT DOCUMENTS

| | | |
|---|---|---|
| KR | 10-2011-0031796 A | 3/2011 |
| KR | 10-2015-0046139 A | 4/2015 |
| KR | 10-2017-0126049 A | 11/2017 |
| KR | 10-2018-0066764 A | 6/2018 |
| KR | 10-2031251 B1 | 10/2019 |

* cited by examiner

*Primary Examiner* — Allan W. Olsen
(74) *Attorney, Agent, or Firm* — Novick, Kim & Lee PLLC; Jae Youn Kim

(57) ABSTRACT

The present invention relates to an etching composition for selectively etching a silicon nitride layer. The etching composition includes an inorganic acid, an epoxy-based silicon compound, and water. The etching composition of the present invention selectively removes a silicon nitride layer while minimizing damage to an underlying metal layer and preventing a silicon oxide layer from being etched.

12 Claims, No Drawings

ETCHING COMPOSITION FOR SILICON NITRIDE FILM

TECHNICAL FIELD

The present invention relates to a composition for selectively etching a silicon nitride layer while preventing a silicon oxide layer from being etched.

BACKGROUND ART

A silicon oxide layer and a silicon nitride layer are representative insulating layers used in a semiconductor manufacturing process. The silicon oxide layer and the silicon nitride layer are used separately, or they are alternately stacked to be used in combination.

The silicon oxide layer and the silicon nitride layer are also used as a hard mask for forming a conductive pattern such as a metal wiring pattern.

Typically, phosphoric acid is used to remove a silicon nitride layer in a semiconductor wet process. The use of phosphoric acid is problematic in that the selectivity for a silicon oxide layer with respect to a silicon oxide layer is not high and pure water must be continuously supplied to prevent the selectivity from changing.

In the silicon nitride layer removal process, there is a problem in that defects occur when the amount of pure water supplied is even slightly changed. In addition, since phosphoric acid is a strong acid, it is corrosive and difficult to handle.

Conventionally, an etching composition prepared by mixing hydrofluoric acid or nitric acid with phosphoric acid is known, but the technique brings a negative result of lowering the selectivity between the silicon nitride layer and the silicon oxide layer. Especially, when hydrofluoric acid is mixed with phosphoric acid, since the number of batches increases, there is a disadvantage in that the selectivity between a silicon nitride layer and a silicon oxide layer significantly changes.

This phenomenon is because the concentration of hydrofluoric acid is changed due to evaporation of the hydrofluoric acid during the process.

Therefore, there is a need for an etching composition with which it is possible to selectively etch a silicon nitride layer with respect to a silicon oxide layer while maintaining a stable process margin according to a process arrangement.

DISCLOSURE

Technical Problem

An objective of the present invention is to provide an etching composition capable of etching a silicon nitride layer while minimizing the etching of a silicon oxide layer, that is, an etching composition capable of selectively etching a silicon nitride layer while preventing a silicon oxide layer from being etched.

Another objective of the present invention is to provide an etching composition that does not cause problems such as generation of particles on the surface of a silicon oxide layer and poor removal of a silicon nitride layer.

Technical Solution

An etching composition to achieve the above objectives of the present invention includes an inorganic acid, an epoxy-based silicon compound, and water.

In a preferred embodiment of the present invention, the epoxy-based silicon compound has an epoxy bond in its molecular structure, and the epoxy-based silicon compound includes at least one selected from the group consisting of gamma-Glycidoxymethyltrimethoxysilane, gamma-Glycidoxyethyltrimethoxysilane, gamma-Glycidoxypropyltrimethoxysilane, gamma-Glycidoxymethyltriethoxysilane, gamma-Glycidoxymethyltripropoxysilane, gamma-Glycidoxyethyltriethoxysilane, gamma-Glycidoxyethyltripropoxysilane, gamma-Glycidoxypropyltriethoxysilane, gamma-Glycidoxypropyltripropoxysilane, beta (3,4-Epoxycyclohexyl)methyltrimethoxysilane, beta-(3,4-Epoxycyclohexyl)ethyltrimethoxysilane, beta-(3,4-Epoxycyclohexyl)propyltrimethoxysilane, beta-(3,4-Epoxycyclohexyl)methyltriethoxysilane, beta-(3,4-Epoxycyclohexyl)methyltripropoxysilane beta, beta-(3,4-Epoxycyclohexyl)ethyltriethoxysilane, beta-(3,4-Epoxycyclohexyl)ethyltripropoxysilane, beta-(3,4-Epoxycyclohexyl)propyltriethoxysilane, and beta-(3,4-Epoxycyclohexyl)propyltripropoxysilane.

The inorganic acid may be any one selected from the group consisting of sulfuric acid, nitric acid, phosphoric acid, and mixtures thereof, and the etching composition may further include sulfuric acid as an additive.

The epoxy-based silicon compound may be included in an amount of 0.005% to 5% by weight with respect to the total amount of the etching composition.

The etching composition may further include a fluorine compound that is included in an amount of 0.01 to 1% by weight with respect to the total amount of the etching composition, and the fluorine compound may be selected from the group consisting of hydrogen fluoride, ammonium fluoride, ammonium hydrogen fluoride, and mixtures of two or more thereof.

The silicon compound may function to effectively prevent a silicon oxide layer from being etched at a temperature of 120° C. to 190° C. during the removal of a silicon nitride layer so that the etching rate for the silicon nitride layer at 160° C. may be 200 or more times higher than the etching rate for the silicon oxide layer.

Advantageous Effects

The etching composition according to the present invention exhibits a high etch selectivity between a silicon nitride layer and a silicon oxide layer and can control the etching rate of a silicon oxide layer while maintaining a good selectivity with respect to underlying layers such as a polysilicon layer. Therefore, the etching composition of the present invention can be widely applied to semiconductor device manufacturing processes. Furthermore, the etching composition has the advantages of absorbing particles on the surface of the silicon oxide layer and addressing the problem of poor removal of the silicon nitride layer.

In addition, since the etching composition of the present invention enables a high etching rate and a high selectivity, the etching composition can be applied to equipment for a single wafer process (SWP).

BEST MODE

Hereinafter, the present invention will be described in detail.

Unless otherwise defined, all terms including technical and scientific terms used herein have the same meaning as commonly understood by those who are ordinarily skilled in the art to which this invention belongs. In general, the nomenclature used herein is that well known and commonly used in the art.

It will be further understood that the terms "comprise", "includes", or "has", when used in this specification, specify the presence of an element, but do not preclude the presence or addition of one or more other elements unless the context clearly indicates otherwise.

An embodiment of the present invention relates to an etching composition including phosphoric acid, an epoxy-based silicon compound, and water, thus the composition being capable of selectively etching a silicon nitride layer while suppressing damage to an underlying metal layer and preventing a silicon oxide layer from being etched.

More particularly, embodiments of the present invention relate to an etching composition for selectively wet-etching a silicon nitride layer in manufacturing processes for DRAM or NAND flash memory devices, the composition exhibiting a silicon nitride etch selectivity of 200 or more.

In the present specification, the term "etching amount" means an amount of reduction of a thin layer thickness before and after etching, and the term "etching rate" means a speed of reduction of a thin layer thickness.

In the present specification, the term "etch selectivity" means the ratio of the etching rate of a silicon nitride layer to the etching rate of a silicon oxide layer.

Hereinafter, specific embodiments of the present invention will be described. However, the embodiments are only for illustrative purposes, and the present invention is not limited thereto.

The composition of the present invention for etching a silicon nitride layer includes an inorganic acid, a silicon-based compound having an epoxy structure, and water.

The inorganic acid may be any one selected from the group consisting of sulfuric acid, nitric acid, phosphoric acid, and mixtures thereof. Preferably, the inorganic acid is phosphoric acid, and the etching composition may further include sulfuric acid as an additive.

Phosphoric acid is the best inorganic acid to secure good etch selectivity and a good etching rate for a silicon nitride layer. When phosphoric acid is used in combination with one or more other inorganic acids, the etch selectivity between the silicon nitride layer and the silicon oxide layer can be adjusted.

The content of the inorganic acid in the etching composition is preferably 80% to 90% by weight. When it is less than 80% by weight, there is a problem in that the etching rate of a nitride layer is lowered while, when it exceeds 90% by weight, it is difficult to obtain a high etch selectivity between a nitride layer to an oxide layer.

The epoxy-based silicon compound may be any one selected from the group consisting of gamma-Glycidoxymethyltrimethoxysilane, gamma-Glycidoxyethyltrimethoxysilane, gamma-Glycidoxypropyltrimethoxysilane, gamma-Glycidoxymethyltripropoxysilane, gamma-Glycidoxymethyltriethoxysilane, gamma-Glycidoxyethyltriethoxysilane, gamma-Glycidoxypropyltriethoxysilane, gamma-Glycidoxypropyltriethoxysilane, gamma-Glycidoxypropyltripropoxysilane, beta-(3,4-Epoxycyclohexyl)methyltrimethoxysilane, beta-(3,4-Epoxycyclohexyl)ethyltrimethoxysilane, beta-(3,4-Epoxycyclohexyl)propyltrimethoxysilane, beta-(3,4-Epoxycyclohexyl)methyltriethoxysilane, beta-(3,4-Epoxycyclohexyl)methyltripropoxysilane, beta (3,4-Epoxycyclohexyl)ethyltriethoxysilane, beta-(3,4-Epoxycyclohexyl)ethyltripropoxysilane, beta-(3,4-Epoxycyclohexyl)propyltriethoxysilane, beta-(3,4-Epoxycyclohexyl)propyltripropoxysilane, and mixtures of two or more thereof.

The content of the epoxy-based silicon compound is not particularly limited, but the content may fall within a range of 0.005% to 5% by weight with respect to the total amount of the etching composition. When the content is less than 0.001% by weight, the effect of preventing a silicon oxide layer is deteriorated. On the other hand, when the content is more than 10% by weight, the effect of improving an etch selectivity between a silicon nitride layer and a silicon oxide layer is reduced, and problems in which defects occur on a silicon nitride layer during etching and undesirable particles remain on the surface of a silicon oxide layer may arise.

The etching composition may further include a fluorine compound in an amount of 0.01% to 1% by weight with respect to the total amount of the composition, and the fluorine compound may be selected from the group consisting of hydrogen fluoride, ammonium fluoride, ammonium hydrogen fluoride, and mixtures of two or more thereof.

When the fluorine compound is included in an amount of less than 0.01% by weight, since the etching rate of a silicon nitride layer is low, it is difficult to remove the silicon nitride layer. On the other hand, when the content of the fluorine exceeds 1% by weight, the etch selectivity between a silicon nitride layer and a silicon oxide layer is reduced because the etching rate of the silicon nitride layer and the etching rate of the silicon oxide are both increased.

The silicon compound may function to effectively prevent a silicon oxide layer from being etched at a temperature of 120° C. to 190° C. during the removal of a silicon nitride layer and may makes the etching rate of the silicon nitride layer at 160° C. 200 or more times higher than the etching rate of the silicon oxide layer.

Herein after, preferable examples of the invention and comparative examples will be described. However, the preferred examples described below are presented only for illustrative purposes and are not intended to limit the present invention.

MODE FOR CARRYING OUT THE INVENTION

Examples 1 to 11

For each of the compositions shown in Table 1 and Table 2, the components for each composition were introduced into an experimental beaker equipped with a magnetic bar according to the composition ratio therefor. The mixtures in the respective beakers were stirred at a speed of 500 rpm for 10 minutes at room temperature to prepare various compositions.

Comparative Examples 1 to 4

Compositions were prepared in the same manner as in the examples according to the composition components and composition ratios shown in Table 1.

TABLE 1

| | Composition | | | | | | Etching rate (A/min.) | | |
|---|---|---|---|---|---|---|---|---|---|
| | Inorganic acid | | Silicon compound | | Water | | Nitride layer | Oxide layer | Selectivity |
| | Component | Content | Component | Content | Component | Content | | | |
| Example 1 | A-1 | 85 | B-1 | 0.01 | C-1 | remainder | 92.3 | 0.3 | 308 |
| Example 2 | A-1 | 85 | B-1 | 0.1 | C-1 | remainder | 91.8 | 0.2 | 459 |
| Example 3 | A-1 | 85 | B-1 | 0.5 | C-1 | remainder | 91.5 | 0.1 | 915 |
| Example 4 | A-1 | 85 | B-1 | 1 | C-1 | remainder | 90.8 | 0.1 | 908 |
| Example 5 | A-1 | 85 | B-2 | 0.2 | C-1 | remainder | 91.6 | 0.2 | 458 |
| Example 6 | A-1 | 85 | B-3 | 0.05 | C-1 | remainder | 91.8 | 0.3 | 306 |
| Example 7 | A-1 | 85 | B-4 | 0.3 | C-1 | remainder | 90.9 | 0.2 | 455 |
| Example 8 | A-1 | 85 | B-5 | 0.1 | C-1 | remainder | 91.5 | 0.2 | 458 |
| Example 9 | A-1 | 85 | B-6 | 0.5 | C-1 | remainder | 91.3 | 0.1 | 913 |
| Comparative Example 1 | A-1 | 85 | B-1 | 0.001 | C-1 | remainder | 92.5 | 0.9 | 103 |
| Comparative Example 2 | A-1 | 85 | B-1 | 10 | C-1 | remainder | 20.3 | 0.2 | 101 |
| Comparative Example 3 | A-1 | 85 | B-7 | 0.1 | C-1 | remainder | 90.3 | 1.4 | 65 |
| Comparative Example 4 | A-1 | 85 | B-8 | 0.5 | C-1 | remainder | 90.8 | 1.1 | 83 |

TABLE 2

| | Composition | | | | | | | | Etching rate (A/min.) | | |
|---|---|---|---|---|---|---|---|---|---|---|---|
| | Inorganic acid | | Silicon compound | | Water | | Fluorine compound | | Nitride layer | Oxide layer | Selectivity |
| | Component | Content | Component | Content | Component | Content | Component | Content | | | |
| Example 3 | A-1 | 85 | B-1 | 0.5 | C-1 | remainder | — | 0 | 91.5 | 0.1 | 915 |
| Example 10 | A-1 | 85 | B-1 | 0.5 | C-1 | remainder | D-1 | 0.1 | 173.9 | 0.1 | 1739 |
| Example 11 | A-1 | 85 | B-1 | 0.5 | C-1 | remainder | D-2 | 0.1 | 208.7 | 0.2 | 1044 |

A-1: phosphoric acid
B-1: gamma-Glycidoxypropyltrimethoxysilane
B-2: glycidoxyetyltriethoxysilane
B-3: gamma-Glycidoxymethyltrimetoxysilane
B-4: gamma-Glycidoxypropyltriprothoxysilane
B-5: beta-(3,4-Epoxycyclohexyl)etyltrimethoxysilane)
B-6: beta-(3,4-Epoxycyclohexyl)propyltrimethoxysilane)
B-7: tetra ethly ortho silicate
B-8: amino propyl triethoxy-silane
C-1: deionized water
D-1: ammonium fluoride (NH$_4$F)
D-2: hydrofluoric acid Characteristics Measurement (Measurement of Etching Rates of Silicon Oxide Layer and Silicon Nitride Layer)

To measure the performance of each of the etching compositions prepared in the examples and the comparative examples, a silicon nitride layer and a silicon oxide layer were deposited on respective wafers using the same CVD method that is used in a semiconductor device manufacturing process, to prepare a silicon nitride wafer and a silicon oxide wafer.

Before etching each of the layers, the initial thickness before etching was measured using a scanning electron microscope and an ellipsometer.

Next, the etching process was performed by immersing the coupons of the silicon oxide wafer and the silicon nitride wafer in each etching composition maintained at 160° C. in a quartz stirring tank stirred at a speed of 500 rpm. After the etching was completed, each wafer was washed with ultra-pure water, and the remaining etching composition and moisture were completely dried using a drying device.

The thickness of each of the dried wafer coupons remaining after the etching was measured using a scanning electron microscope and an ellipsometer.

The etching rate was measured on the basis of a change in the thickness of the thin layer before and after the etching.

Referring to Table 1, the etching compositions of Examples 1 to 9 exhibit an excellent selective etching rate for a silicon nitride layer compared to that for a silicon oxide layer, which is achieved by suppressing the etching of the silicon oxide layer.

From the results, it is confirmed that the etching composition of the present invention improves the etching rate, the etch selectivity, and the etching stability of a silicon nitride layer due to the presence of the epoxy-based silicon compound. That is, the present invention provides an etching composition capable of improving the efficiency of an etching process.

Referring to Table 2, as in Examples 10 to 11, when the etching compositions in which an epoxy-based silicon compound serving as an etching inhibitor for a silicon oxide layer and a fluorine compound serving as an etching enhancer for a silicon nitride layer are both included are used, the etching rate of the silicon nitride layer is remarkably increased due to the addition of the fluorine compound but the etching rate of the silicon oxide layer hardly changes.

Compared with Example 3 in which the fluorine compound was not used, the etching rate of the silicon nitride layer is increased by almost two or more times due to the action of the fluorine compound, but the etching rate of the oxide layer is just little changed due to the action of the silicon oxide layer etch inhibitor. Therefore, the effect of greatly improving the etch selectivity is obtained.

Therefore, the etching composition of the present invention enables a high etching rate and a high selectivity when being used in a process of etching a silicon nitride layer, thereby being applicable to equipment for a single wafer process (SWP).

Characteristics Measurement (Detection of Particles and Abnormal Growth of Silicon Oxide Layer)

Reaction by-products generated by the etching composition may accumulate, thereby increasing the thickness of the layer on which the etching process is performed. This phenomenon is called abnormal growth. In addition, reaction by-products generated by the etching composition may generate particles. When the abnormal growth or particles occur, various defects may occur in the subsequent process.

The surfaces of the silicon oxide layers etched in Comparative Examples 1 to 4 and Examples 1 to 11 were scanned with an electron microscope (SEM) to examine whether particles were generated, and the vertical cross-sections of the etched silicon oxide layers were photographed with an electron microscope (SEM). The results of testing for abnormal growth are shown in Table 3 below.

TABLE 3

| | Presence/absence of particles | Presence/absence of abnormal growth |
| --- | --- | --- |
| Example 1 | X | X |
| Example 2 | X | X |
| Example 3 | X | X |
| Example 4 | X | X |
| Example 5 | X | X |
| Example 6 | X | X |
| Example 7 | X | X |
| Example 8 | X | X |
| Example 9 | X | X |
| Example 10 | X | X |
| Example 11 | X | X |
| Comparative Example 1 | X | ○ |
| Comparative Example 2 | ○ | ○ |
| Comparative Example 3 | ○ | ○ |
| Comparative Example 4 | ○ | ○ |

When comparing Examples 1 to 11 with Comparative Examples, as shown in Table 3, neither particles nor abnormal growth occurred in the etching compositions of Examples 1 to 11 according to the present invention were used.

In contrast, abnormal growth occurred when the etching composition of Comparative Example 1 was used, and both particles and abnormal growth occurred when the etching compositions of Comparative Examples 2 to 4 were used.

In conclusion, the etching composition according to the present invention can reduce the occurrence of defects by minimizing particles and abnormal growth during an etching process.

The invention claimed is:

1. An etching composition for a silicon nitride layer, the composition comprising an inorganic acid, an epoxy-based silicon compound, and water,
   wherein the composition comprises 80% to 90% by weight of the inorganic acid, 0.005% to 5% by weight of the epoxy-based silicon compound, and the water accounting for the remaining proportion.

2. The composition of claim 1, further comprising a fluorine compound.

3. The composition of claim 2, wherein the fluorine compound is selected from the group consisting of hydrogen fluoride, ammonium fluoride, ammonium hydrogen fluoride, or mixtures of two or more thereof.

4. The composition of claim 2, wherein the epoxy-based silicon compound is any one selected from the group consisting of gamma-Glycidoxymethyltrimethoxysilane, gamma-Glycidoxyethyltrimethoxysilane, gamma-Glycidoxypropyltrimethoxysilane, gamma-Glycidoxymethyltriethoxysilane, gamma-Glycidoxymethyltripropoxysilane, gamma-Glycidoxyethyltriethoxysilane, gamma-Glycidoxyethyltripropoxysilane, gamma-Glycidoxypropyltriethoxysilane, gamma-Glycidoxypropyltripropoxysilane, beta-(3,4-Epoxycyclohexyl)methyltrimethoxysilane, beta-(3,4-Epoxycyclohexyl)ethyltrimethoxysilane, beta-(3,4-Epoxycyclohexyl)propyltrimethoxysilane, beta-(3,4-Epoxycyclohexyl)methyltriethoxysilane, beta-(3,4-Epoxycyclohexyl)methyltripropoxysilane, beta-(3,4-Epoxycyclohexyl)ethyltriethoxysilane, beta-(3,4-Epoxycyclohexyl)ethyltripropoxysilane, beta-(3,4-Epoxycyclohexyl)propyltriethoxysilane, beta-(3,4-Epoxycyclohexyl)propyltripropoxysilane, and mixtures of two or more thereof.

5. The composition of claim 2, wherein the inorganic acid is selected from the group consisting of sulfuric acid, nitric acid, phosphoric acid, and mixtures of two or more thereof.

6. The composition of claim 2, wherein the epoxy-based silicon compound inhibits the silicon oxide layer from being etched at a temperature in a range of from 120° C. to 190° C.

7. The composition of claim 1, wherein the epoxy-based silicon compound is any one selected from the group consisting of gamma-Glycidoxymethyltrimethoxysilane, gamma-Glycidoxyethyltrimethoxysilane, gamma-Glycidoxypropyltrimethoxysilane, gamma-Glycidoxymethyltriethoxysilane, gamma-Glycidoxymethyltripropoxysilane, gamma-Glycidoxyethyltriethoxysilane, gamma-Glycidoxyethyltripropoxysilane, gamma-Glycidoxypropyltriethoxysilane, gamma-Glycidoxypropyltripropoxysilane, beta-(3,4-Epoxycyclohexyl)methyltrimethoxysilane, beta-(3,4-Epoxycyclohexyl)ethyltrimethoxysilane, beta-(3,4-Epoxycyclohexyl)propyltrimethoxysilane, beta-(3,4-Epoxycyclohexyl)methyltriethoxysilane, beta-(3,4-Epoxycyclohexyl)methyltripropoxysilane, beta-(3,4-Epoxycyclohexyl)ethyltriethoxysilane, beta-(3,4-Epoxycyclohexyl)ethyltripropoxysilane, beta-(3,4-Epoxycyclohexyl)propyltriethoxysilane, beta-(3,4-Epoxycyclohexyl)propyltripropoxysilane, and mixtures of two or more thereof.

8. The composition of claim 1, wherein the inorganic acid is selected from the group consisting of sulfuric acid, nitric acid, phosphoric acid, and mixtures of two or more thereof.

9. The composition of claim 8, wherein the inorganic acid is phosphoric acid and sulfuric acid.

10. The composition of claim 1, wherein the epoxy-based silicon compound inhibits the silicon oxide layer from being etched at a temperature in a range of from 120° C. to 190° C.

11. The composition of claim 10, wherein the composition etches the silicon nitride layer at an etching rate that is 200 or more times higher than that of the silicon oxide layer at 160° C.

12. The composition of claim 11, wherein the composition etches the silicon nitride layer at an etching rate that is 1000 or more times higher than that of the silicon oxide layer.

\* \* \* \* \*